(12) United States Patent
Yune

(10) Patent No.: US 8,034,544 B2
(45) Date of Patent: Oct. 11, 2011

(54) METHOD FOR FORMING FINE CONTACT HOLE PATTERN OF SEMICONDUCTOR DEVICE

(75) Inventor: Hyoung Soon Yune, Seoul (KR)

(73) Assignee: Hynix Semiconductor, Inc., Icheon (KR)

( * ) Notice: Subject to any disclaimer, the term of this patent is extended or adjusted under 35 U.S.C. 154(b) by 29 days.

(21) Appl. No.: 12/481,523

(22) Filed: Jun. 9, 2009

(65) Prior Publication Data

US 2010/0112463 A1    May 6, 2010

(30) Foreign Application Priority Data

Nov. 3, 2008  (KR) ........................ 10-2008-0108447

(51) Int. Cl.
   *G03F 7/00*   (2006.01)
   *G03F 1/00*   (2006.01)
   *G03F 5/00*   (2006.01)
(52) U.S. Cl. ............. 430/313; 430/5; 430/312; 430/394
(58) Field of Classification Search .......... 430/311–314, 430/5, 394
See application file for complete search history.

(56) References Cited

U.S. PATENT DOCUMENTS

| 6,861,176 B2 * | 3/2005 | Wu et al. ............................ 430/5 |
| 2004/0137375 A1 * | 7/2004 | Nolscher ....................... 430/316 |
| 2004/0234900 A1 * | 11/2004 | Schroeder ..................... 430/313 |
| 2009/0258318 A1 * | 10/2009 | Chan ............................. 430/312 |

FOREIGN PATENT DOCUMENTS

| KR | 1020030001986 A | 1/2003 |
| KR | 1020080084253 A | 9/2008 |
| WO | WO 97/45772 A1 | 12/1997 |

OTHER PUBLICATIONS

Toshiyuki Toyoshima et al., "0.1 μm Level Contact Hole Pattern Formation with KrF Lithography by Resolution Enhancement Lithography Assisted by Chemical Shrink (RELACS)," IEEE, 1998, pp. 333-336.

* cited by examiner

*Primary Examiner* — Mark F Huff
*Assistant Examiner* — Stewart Fraser

(57) ABSTRACT

A method for forming a fine contact hole of a semiconductor device comprises performing two-step etching processes using a first exposure mask including a plurality of rectangular light transmitting regions each having a given pitch and a second exposure mask including a plurality of rectangular light transmitting regions arranged a shielding region of the first exposure mask with a 'cross (+)' shape in the center of rectangular light transmitting regions of the second exposure mask. Each of four corner regions of the light transmitting regions of the first exposure mask is overlapped with four corner regions of rectangular light transmitting regions of the second exposure mask. As a result, the fine contact hole pattern obtained by the method has a uniform size.

8 Claims, 7 Drawing Sheets

US 8,034,544 B2

METHOD FOR FORMING FINE CONTACT HOLE PATTERN OF SEMICONDUCTOR DEVICE

CROSS-REFERENCE TO RELATED APPLICATION

Priority to Korean patent application number 10-2008-108447, filed on Nov. 3, 2008, the whole disclosure of which is incorporated by reference, is claimed.

BACKGROUND OF THE INVENTION

The invention relates to a method for forming a fine contact hole pattern of a semiconductor device.

As a manufacturing technology of semiconductor devices is developed and an application field of memory devices is enlarged, a technology of manufacturing a memory device of high capacity has been required with improved integration and un-degraded electric characteristics.

As a result, multilateral research has been made to improve photolithography processes, cell structures, and physical property limits of materials which form wires and insulating films.

It is difficult to form a contact hole pattern of less than 50 nm using a single ArF exposure process that has a numerical aperture (NA) of less than 1.0 even though an immersion lithography process is performed. In order to improve the resolution in the lithography process and enlarge a process margin, a resist flow process (RFP) or a method using a Resolution Enhancement Lithography Assisted by Chemical Shrink (RELACS) material ("0.1 µm Level Contact Hole Pattern Formation with KrF lithography by Resolution Enhancement Lithography Assisted by Chemical Shrink", IEEE, pp. 12.5.1-12.5.4, 1998 Advanced Technology R&D Ctr., Mitsubishi Electric Corp.) has been developed.

The resist flow process that has been generally used includes patterning a resist and then flowing a photoresist material at high temperature to reduce a contact hole pattern size. However, in the case of the resist flow process, even when the same thermal energy is transmitted to the whole photoresist surface, the flow of photoresist is different in an upper portion, a middle portion and a lower portion of a contact hole. Also, since the amount of flowing photoresist is different depending on pattern density, it is difficult to obtain a fine pattern reduced with a uniform size.

For example, as shown in FIG. 1a, a lithography process is performed on a photoresist film 1 of an underlying layer to form a contact hole pattern 2. When a resist flow process is performed, as shown in FIG. 1b, a contact hole pattern 2-1 that has a smaller size than that of a desired contact hole is formed in a region having a low pattern density due to a large amount of flowing photoresist. Moreover, a contact hole pattern 2-2 is formed to be asymmetrical in left and right sides. In other words, it is difficult to obtain a contact hole pattern reduced with a uniform size over a wafer. As a result, it is impossible to obtain a stable process margin for a subsequent process, thereby degrading yield and reliability of the device.

BRIEF SUMMARY OF THE INVENTION

In one embodiment, the present invention, relates to an exposure mask for forming a pattern, the mask comprising a first exposure mask including a plurality of rectangular light transmitting regions each having a given pitch; and a second exposure mask including a plurality of rectangular light transmitting regions overlapped at four corner regions of the light transmitting regions of the first exposure mask.

The pitch means the minimum pitch size that can be obtained by a currently used exposer. A shielding region of the first exposure mask is arranged with a 'cross (+)' shape in the center of light transmitting regions of the second exposure mask. The area of the light transmitting region of the first exposure mask overlapped with the light transmitting region of the second exposure mask is a portion ranging from 5 to 10%, preferably 6.25% (1/16), to the whole transmitting region of the first exposure mask. The rectangular light transmitting regions of the first exposure mask and the second exposure mask includes, but is not limited to, a polygon such as circular, triangular or pentagonal as well as square or rectangular if necessary.

In another embodiment, the present invention relates to a method for forming a fine contact hole pattern of a semiconductor device that comprises performing a two-step etching process using two kinds of exposure masks, thereby obtaining a fine pattern that has a reduced minimum pattern pitch.

According to an embodiment present invention, a method for forming a fine contact of a semiconductor device comprises: forming a mask pattern having a plurality of first rectangular opening over an underlying layer of a substrate; forming an insulating film over the mask pattern to fill the first holes with the insulating film; forming a photoresist pattern having a plurality of rectangular opening over the mask pattern filled with the insulating film, wherein the second rectangular opening of the photoresist pattern exposes a corner region of the first rectangular opening of the mask pattern filled with the insulating film; and etching the underlying layer with the mask pattern and the photoresist pattern as etch masks to form an underlying layer pattern having a plurality of second holes.

In the method, the substrate is a manufacturing substrate for a DRAM, a LOGIC, a SRAM or a flash memory device. The substrate has lines such as a gate and a bit line.

Any of i-line, KrF, ArF or EUV chemically amplified type photoresist films can be used as the first and second photoresist films.

The mask pattern that has a different etching selectivity ratio from that of the insulating film and the underlying layer is a material that can be used as a mask in the etching process performed on the underlying layer. For example, the mask film includes an amorphous carbon layer. The insulating film includes an oxide film, a nitride film and an oxide nitride film that can be easily etched in the etching process using the photoresist pattern as an etching mask.

The area of the first holes of the mask pattern exposed through the opening of the photoresist pattern occupies a portion ranging from 5 to 10%, preferably 6.25% (1/16), to the whole area of first holes of the mask pattern.

The filling-the-insulating-film includes filling the insulating film over the substrate including the mask pattern and performing a planarizing process like a chemical mechanical polishing (CMP) process until the mask pattern is exposed.

The size of the second hole of the underlying layer pattern obtained after the underlying layer is etched is the same as that of the first hole of the mask pattern exposed through the opening of the photoresist pattern.

According to an embodiment of the present invention, a method for forming a fine contact hole of a semiconductor device comprises: forming a mask film over an underlying layer of a substrate; forming a first photoresist film over the mask film; patterning the first photoresist film by a first lithography process using a first exposure mask to form a first photoresist pattern including a plurality of first openings; first etching the mask film with the first photoresist pattern as an etching mask to form a mask pattern including a plurality of first holes; forming an insulating film over the mask pattern to fill the first holes with the insulating film; forming a second photoresist film over the mask pattern filled with the insulating film; patterning the second photoresist film by a second lithography process using a second exposure mask to form a second photoresist pattern having a plurality of second openings, wherein a corner region of the mask pattern filled with the insulating film is exposed through each of four corner regions of the second opening of the second photoresist pattern so that the mask pattern is exposed with a 'cross (+)' shape in the center of the second opening of the second photoresist pattern; and second etching the insulating film and the underlying layer with the second photoresist pattern as etching masks until the substrate is exposed, thereby obtaining an underlying layer pattern having a plurality of second holes. Herein, the first and second holes are rectangular.

In the method, the first etching process is performed with a mask film until the underlying layer is exposed, and the second etching process is performed by selectively etching the insulating film and the underlying layer until the substrate or the lines disposed over the substrate is exposed while the mask film is not damaged. As a result, the first etching process is performed under a different etching condition from that of the second etching process.

In the method, since the second photoresist pattern used as an etching mask is removed in the second etching process, the second etching process does not include an additional step for removing the second photoresist pattern.

The size of the second holes formed over the underlying layer pattern by the method is the same as that of the area of first holes of the mask pattern exposed through second openings of the second photoresist pattern. Specifically, the contact hole pattern formed over the underlying layer occupies a portion ranging from 5 to 10%, preferably $\frac{1}{16}$, to the whole area of the contact hole pattern having the minimum pitch that can be obtained by a current exposer.

In the aforementioned method, it is possible to obtain a contact hole having a fine pattern pitch which is smaller than the minimum pattern pitch obtained by the current exposer through the two-step etching process.

DESCRIPTION OF SPECIFIC EMBODIMENTS

Figure 1A:
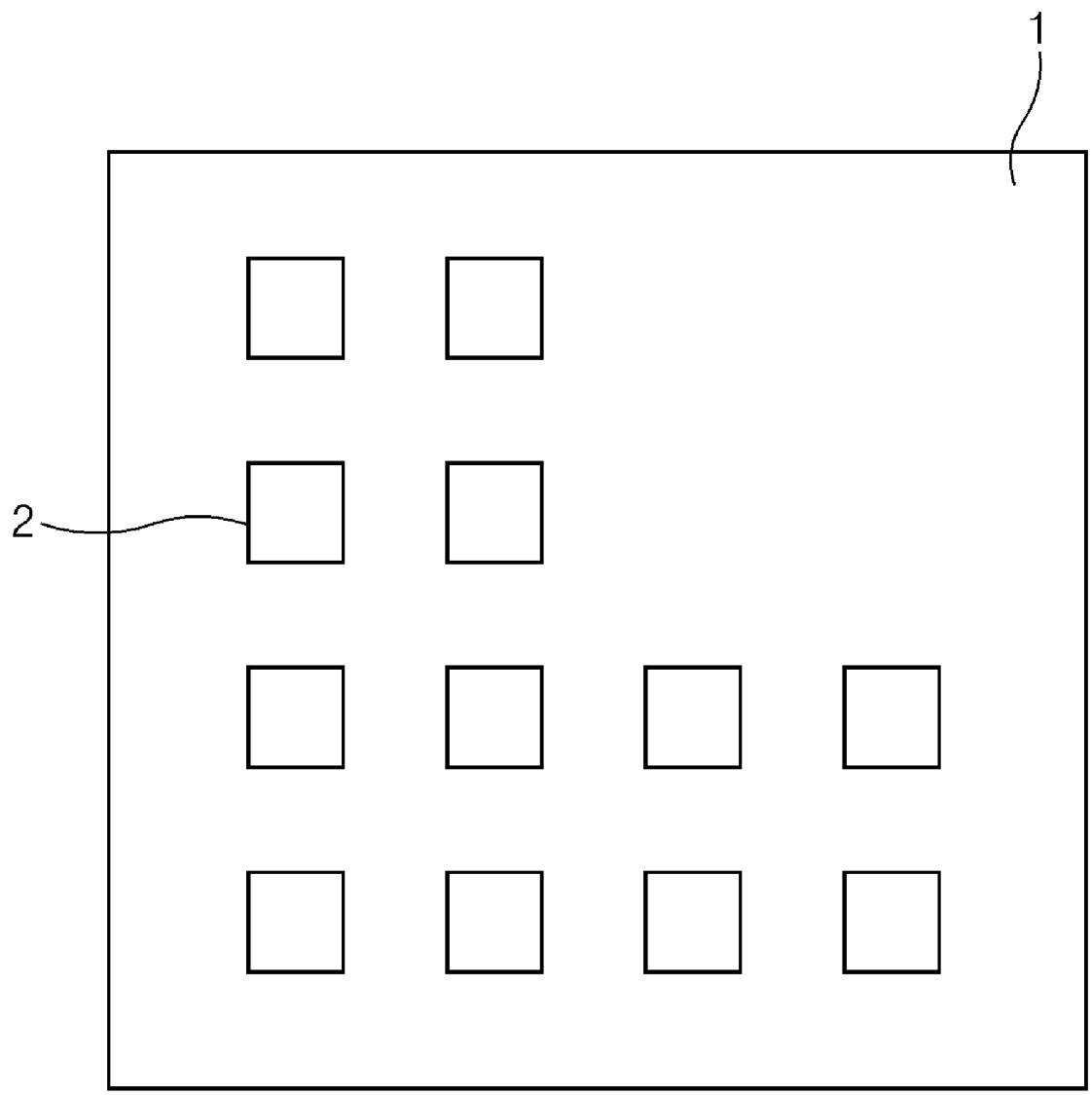
FIGS. 1a and 1b are plane diagrams illustrating a fine pattern obtained by a conventional resist flow process.
Figure 1B:
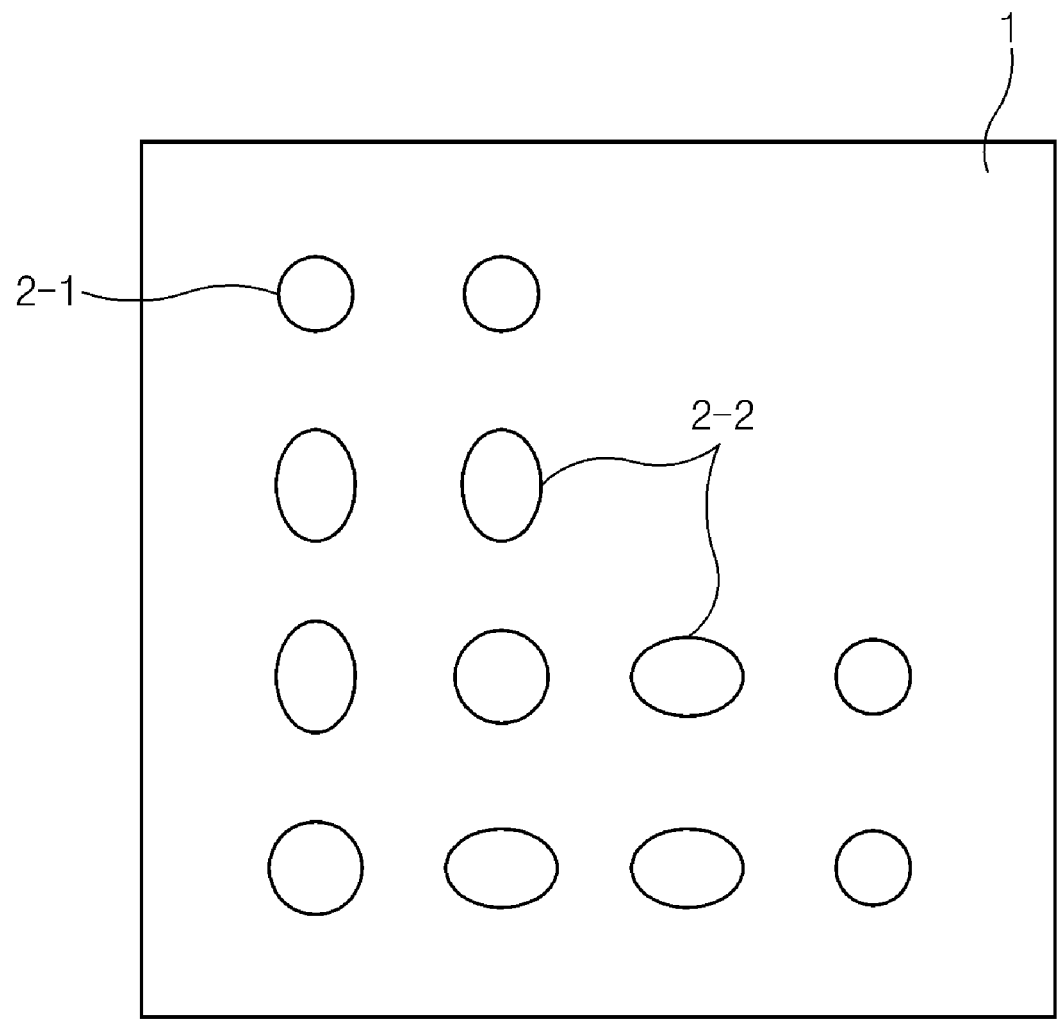
Figure 2:
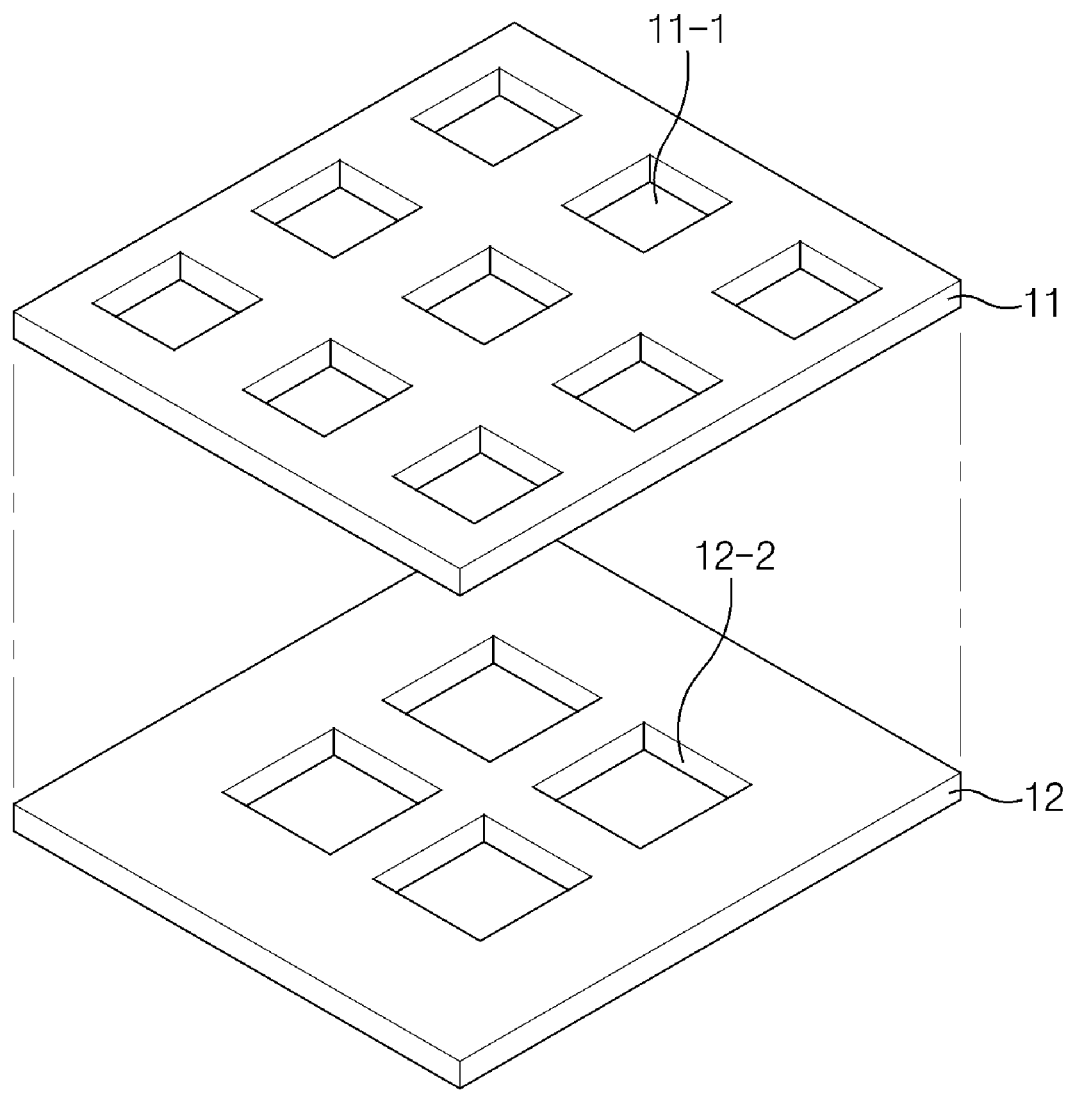
FIG. 2 is a diagram illustrating a first and second exposure masks according to an embodiment of the present invention.

Referring to FIG. 2, a first exposure mask (11) including a plurality of rectangular light transmitting regions (11-1) each having a given (minimum) pitch and a second exposure mask (12) including a plurality of rectangular light transmitting regions (12-1) each having a given (minimum) pitch are provided.

FIGS. 3a to 3e are diagrams illustrating a method for forming a pattern of a semiconductor device according to an embodiment of the present invention.

Figure 3A:
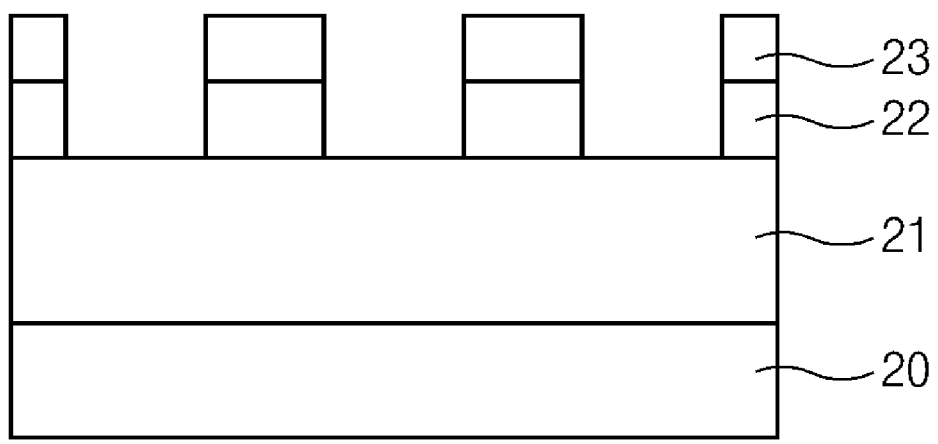
FIGS. 3a to 3e are diagrams illustrating a method for forming a pattern of a semiconductor device according to an embodiment of the present invention.

Referring to FIG. 3a, a mask film (not shown) and a first photoresist film (not shown) are formed over an underlying layer 21 of a semiconductor substrate 20 that includes lines such as a gate or bit line.

The semiconductor substrate 20 is a substrate for manufacturing a semiconductor device (e.g., a DRAM, a LOGIC device, a SRAM or a flash memory device). The substrate has lines such as a gate and a bit line. The mask film includes an amorphous carbon layer.

A first exposure mask (11) including a plurality of rectangular light transmitting regions (11-1) is disposed over the first photoresist film (not shown). A first lithography process is performed with the first exposure mask, thereby obtaining a first photoresist pattern 23 that includes a plurality of first opening having a minimum pattern pitch. A light transmitting region of the first exposure mask may be formed in a shape of a square. Other shapes such as circular, triangular, pentagonal as well as rectangular may also be used.

The mask film (not shown) is first etched with the first photoresist pattern 23 as an etching mask, thereby forming a mask pattern 22 including a plurality of first holes having rectangular type (not shown).

Figure 3B:
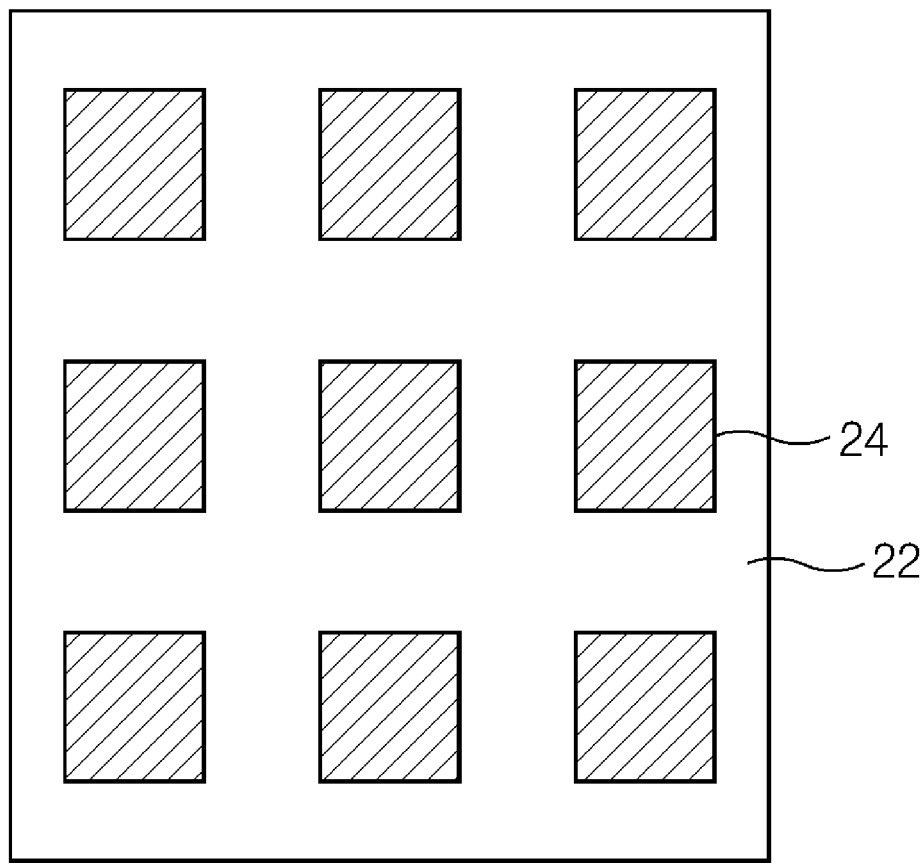
Figure 3B:
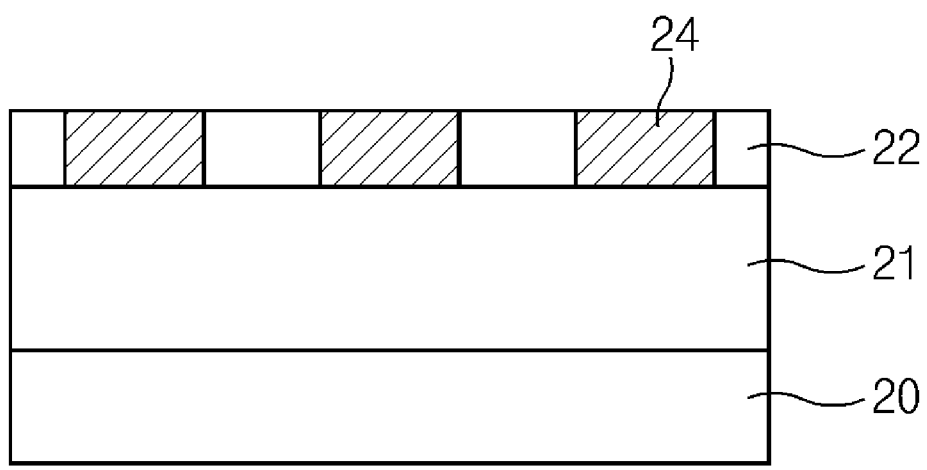

Referring to FIG. 3b, after the first photoresist pattern 23 is removed, an insulating film 24 is deposited over the mask pattern 22 including rectangular openings. A planarizing process is performed to remove the insulating film 24 and expose the mask pattern 22. The insulating film 24 remaining after the polishing process fills the rectangular openings of the mask pattern 22. The insulating film 24 (e.g., an oxide film, a nitride film, or an oxide nitride film) has a different etching selectivity ratio from that of the mask pattern 22.

Figure 3C:
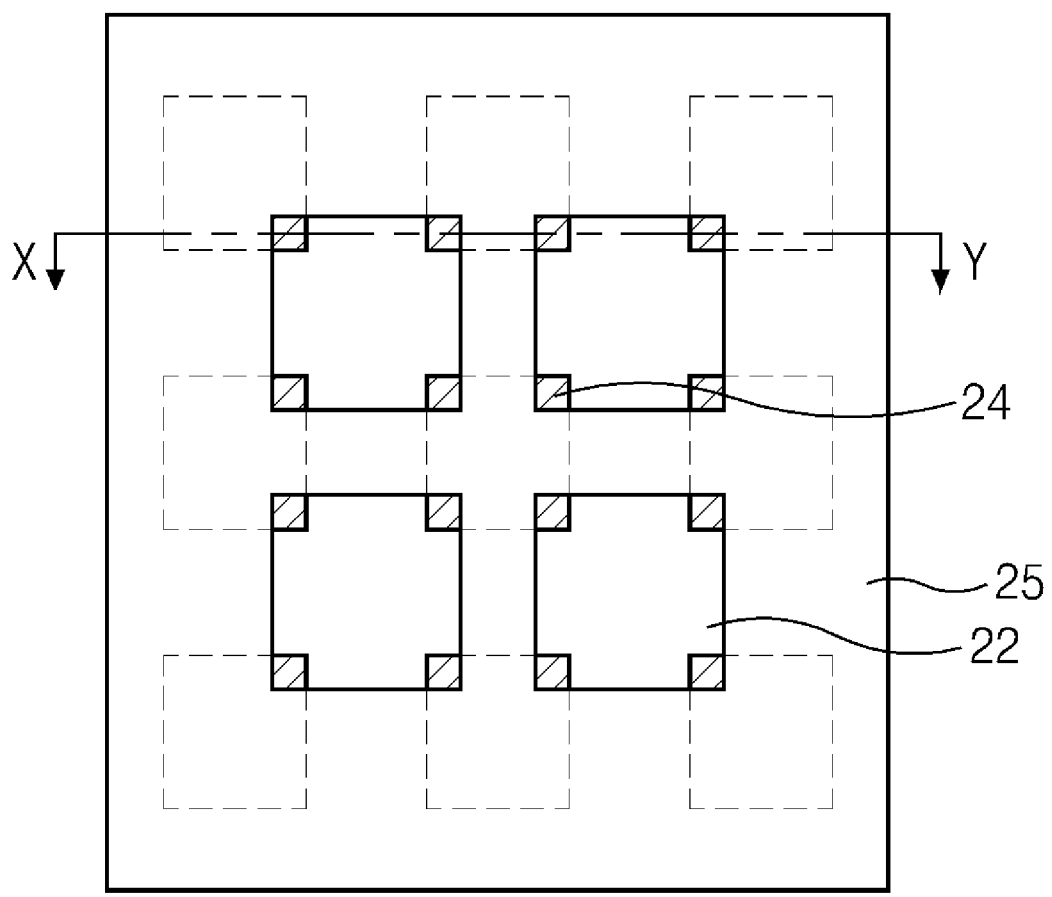
Figure 3C:
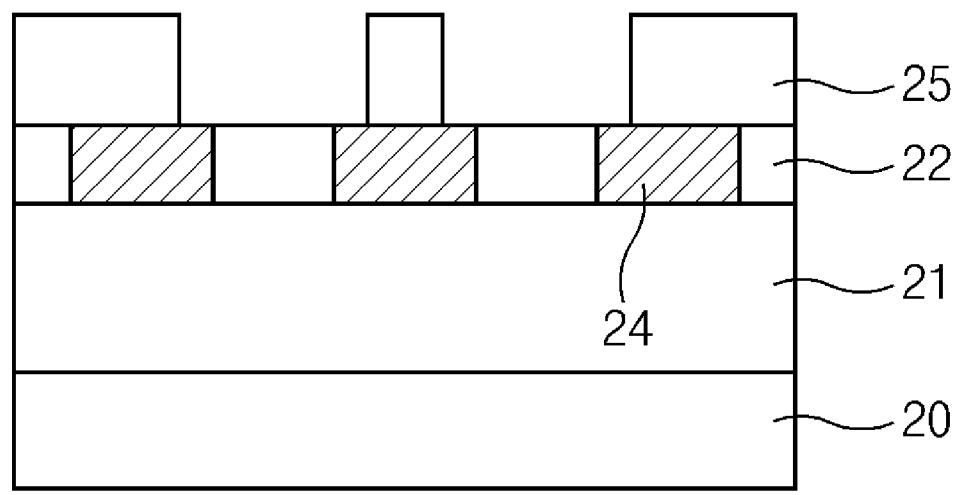

Referring to FIG. 3c, a second photoresist film (not shown) is formed over the mask pattern 22 filled with the insulating film 24. A second lithography process is performed with a second exposure mask (not shown), thereby forming a second photoresist pattern 25 that includes an plurality of second openings (not shown).

The second exposure mask (12) is disposed so that a corner region of the rectangular light transmitting region (11-1) of the first exposure mask (11) is overlapped with that of the light transmitting region (12-1) of the second exposure mask. As a result, the corner region part of the insulating film 24 is exposed through each corner of the opening of the second photoresist pattern 25 and the mask pattern 22 is exposed with a 'cross (+)' shape in the center of the opening of the second photoresist pattern 25. The area of one corner region of the insulating film 24 exposed through the opening of the second photoresist pattern 25 occupies a portion ranging from 5 to 10%, preferably 6.25% ($\frac{1}{16}$), to the whole area of the insulating film 24 filled in the mask pattern 22.

Figure 3D:
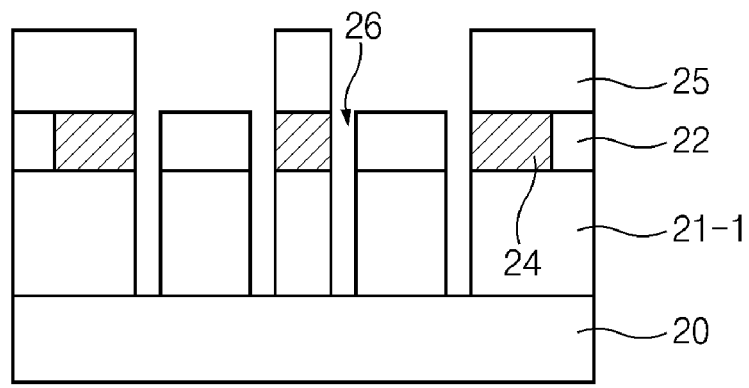
Figure 3E:
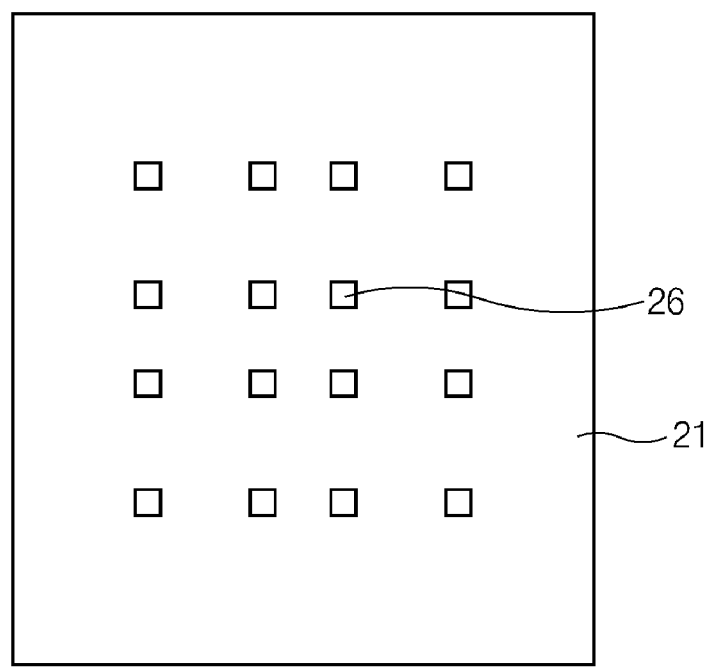

Referring to FIGS. 3d and 3e, the insulating film 24 and the underlying layer 21 located at the lower portion of the insulating film 24 are etched with the second photoresist pattern 25 and the exposed mask pattern 22 as etching masks until the substrate 20 is exposed.

The second etching process is performed under a condition where the mask pattern 22 is not damaged, and the insulating film 24 and the underlying layer 21 are selectively etched.

As a result, it is possible to obtain the underlying layer pattern 21-1 that includes a plurality of second holes 26 having a fine pattern size that is smaller than the minimum pattern pitch size obtained by the current exposer. The size of the second hole 26 of the underlying layer pattern is the same as that of the area of the insulating film 24 exposed through the second opening of the second photoresist pattern 25. Specifically, the size of the final contact hole pattern 26 obtained by the method of the present invention occupies a portion ranging from 5 to 10%, preferably 6.25% (1/16), to the whole area of the contact hole obtained with the first exposure mask.

Meanwhile, a subsequent removing process is not additionally performed because the second photoresist pattern 25 is removed when the insulating film 24 and the underlying layer 21 are etched in the etching process.

As described above, the present invention provides a method for performing a double etching process using two kinds of exposure masks, so that it is possible to form a uniform-sized contact hole having a pitch that is smaller than the minimum resolution obtained by a current exposer, thereby securing a desired process margin and improving yield and reliability of the semiconductor device.

The above embodiments of the disclosure are illustrative and not limitative. Various alternatives and equivalents are possible. The invention is not limited by the type of deposition, etching polishing, and patterning steps describe herein. Nor is the invention limited to any specific type of semiconductor device. For example, the disclosure may be implemented in a dynamic random access memory (DRAM) device or non volatile memory device. Other additions, subtractions, or modifications are obvious in view of the present disclosure and are intended to fall within the scope of the appended claims.

What is claimed is:

1. A method for forming a fine contact hole of a semiconductor device, the method comprising:
    forming a mask pattern having a first rectangular opening by a lithography process using an exposure mask including a plurality of rectangular light transmitting regions over an underlying layer of a substrate;
    forming an insulating film over the mask pattern to fill the first rectangular opening with the insulating film;
    forming a photoresist pattern having a second rectangular opening over the mask pattern filled with the insulating film, wherein the mask pattern is exposed with a 'cross (+)' shape in the center of the second rectangular opening of the photoresist pattern and a corner region of the mask pattern filled with the insulating film is exposed through each of four corner regions of the second rectangular opening of the photoresist pattern; and
    etching the underlying layer with the mask pattern and the photoresist pattern as etch masks to form an underlying layer pattern.

2. The method according to claim 1, wherein the mask pattern has a different etching selectivity ratio from that of the insulating film and the underlying layer.

3. The method according to claim 1, wherein the area of the rectangular opening of the mask pattern exposed through the rectangular opening of the photoresist pattern occupies 5 to 10% to the total area of the first rectangular opening of the mask pattern.

4. The method according to claim 1, further comprising performing a planarizing process until the mask pattern is exposed after the insulating film is formed over the mask pattern to fill the first rectangular opening.

5. The method according to claim 1, wherein the size of the contact hole pattern of the underlying layer obtained after the underlying layer is etched is substantially the same as that of the first rectangular opening of the mask pattern exposed by the second opening of the photoresist pattern.

6. A method for forming a fine contact hole of a semiconductor device, the method comprising:
    forming a mask film over an underlying layer of a substrate;
    forming a first photoresist film over the mask film;
    patterning the first photoresist film by a first lithography process using a first exposure mask to form a first photoresist pattern including a plurality of first openings;
    etching the mask film with the first photoresist pattern as an etching mask to form a mask pattern including a plurality of first holes;
    forming an insulating film over the mask pattern to fill the first holes with the insulating film;
    forming a second photoresist film over the mask pattern filled with the insulating film;
    patterning the second photoresist film by a second lithography process using a second exposure mask to form a second photoresist pattern including a plurality of second openings; and
    etching the insulating film and the underlying layer with the second photoresist pattern and the exposed mask pattern as etching masks at least until the substrate is exposed, thereby obtaining an underlying layer pattern including a plurality of second holes,
    wherein the first and second holes are rectangular openings, and
    wherein the mask pattern is exposed with a 'cross (+)' shape in the center of the second opening of the second photoresist pattern and a corner region of the mask pattern filled with the insulating film is exposed through each of four corner regions of the second opening of the second photoresist pattern.

7. The method according to claim 6, wherein the area of the hole of the mask pattern exposed through the second opening of the second photoresist pattern occupies 5 to 10% to the total area of the first holes of the mask pattern.

8. The method according to claim 6, wherein the size of the second hole of the underlying layer obtained after the underlying layer is etched is substantially the same as that of the first hole of the mask pattern filled with the insulating film exposed by the second opening of the second photoresist pattern.

* * * * *